Dec. 15, 1970 J. W. McGREW 3,547,706

JUNCTION ASSEMBLY FOR THERMOCOUPLES

Filed April 21, 1967

INVENTOR.
JOHN W. McGREW

BY [signature]

ATTORNEY

United States Patent Office 3,547,706
Patented Dec. 15, 1970

3,547,706
JUNCTION ASSEMBLY FOR THERMOCOUPLES

John W. McGrew, Westminster, Md., assignor, by mesne assignments, to Teledyne, Inc., Los Angeles, Calif., a corporation of Delaware Filed Apr. 21, 1967, Ser. No. 632,593
Int. Cl. H01v 1/04
U.S. Cl. 136—205 3 Claims

ABSTRACT OF THE DISCLOSURE

A junction assembly for bonding thermoelectric elements to hot shoes. The assembly uses a cup-shaped structure having a very thin thickness which is bonded to the hot shoe and serves as a diffusion barrier. The hot shoe is selected having a coefficient of thermal expansion substantially near that of the thermoelectric material and, by virtue of the cup-hot shoe bond, forces the cup structure to contort in sympathy with strains thermally induced in the shoe.

BACKGROUND OF THE INVENTION

Field of the invention

The present invention relates to assemblies for mounting thermoelements within the thermopile units of thermoelectric generators, and more particularly to an improved junction assembly for bonding thermoelements to their associated conductors.

Description of the prior art

The generation of power through the use of coupled thermoelements disposed within series interconnected groupings known as thermopiles has been the subject of intensive investigation during the recent past. Inasmuch as the thermopiles generate electrical power through heat alone and with static energy transfer or conversion, they have a recognized value especially for uses in very remote, unattended terrestrial or space locals. The effectiveness of the thermoelectric generators for conventional energy development has remained somewhat uncertain, however, since their reliability is difficult to maintain at cost levels competitive with conventional power sources.

One of the more paramount of the research efforts geared to improving the generators has been directed to the problem of enhancing the operational life spans of the thermoelements. Obviously, improvements developed in this area of technical endeavor will be found fruitful to both remote generator application as well as to local utilization schemes. Closely aligned with the research efforts addressed to improving opeartional lifespan is a parallel endeavor in materials research aimed at increasing the output power performance of the individual thermoelements. At the present time, the alloys, compounds and mixtures found more durable for incorporation within the thermoelements of the generators are selected by virtue of their lower resistivity and higher value of Seebeck coefficient. However, the materials are additionally characterized in retaining physical properties somewhat difficult to cope with. The general physical nature of the thermoelements renders them brittle, highly sensitive to shock damage and difficult to mount and interconnect to hot shoes, electrical conductors and the like. Additionally contributing to design complexity, thermoelectric systems perform most efficiently under conditions imposing a relatively high differential of temperature across the lengths of the thermoelements. As a consequence, the generators must be operated at somewhat elevated temperatures which, in turn, introduce environmental conditions within a thermopile that must be accounted for in order to attain acceptable operating life spans.

The degradation of output performance of the thermoelectric elements nominally arises from their temperature of operation and from the exigencies of what is usually a hostile operating environment. These environmental conditions have been observed to derive a grouping of more specific causes of thermoelement degradation as are outlined below:

(a) Thermal strain matching

Most of the more efficient thermoelectric materials known today, as a result of their being brittle in nature are prone to fracture when subjected to stresses at their junction with hot shoes or the like. Unless the respective coefficients of thermal expansion of both the element and the hot shoe bonded to its heated end are carefully matched, shear stresses induced by strain variations across the hot junction will degrade or destroy thermocouple effectiveness.

Compounded with the above necessity for accommodating thermal strain characteristics, the individual thermoelements must additionally be both chemically and thermoelectrically compatible with their thermopile environment in order to combat progressive degradation.

(b) Thermoelectric compatibility

The term "thermoelectric compatibility" looks particularly to the phenomena of the intercrystalline diffusion of contaminants from the hot shoe and junction bond into the thermoelement. For instance, metals such as nickel, cobalt and chromium, when diffused into the more popular of thermoelement materials, tend to raise the resistivity of the materials sufficiently to seriously degrade and, most often, incapacitate them. On the other hand, the noble metals and particularly copper, also have been found to readily diffuse within contiguous thermoelectric materials. When thusly diffused across a hot junction, these contaminants so alter the Seebeck values of the thermoelectric materials as to poison and ruin them.

In order to overcome thermoelectric incompatibility resulting from the above discussed diffusion poisoning, it has been the practice of the industry to introduce a diffusion barrier formed from a disk of iron or suitably compatible material between the hot end of a thermoelement and the contiguous hot shoe or interconnective strap. The insertion of this iron disk, however, has been observed to interpose a new and serious defect into the thermocouple structure. While the hot shoe or strap advantageously may be selected from a metal characterized in having a sympathetic or substantially matching coefficient of thermal expansion, none of the diffusion barrier materials available at present will similarly react in thermal strain. As a consequence, a high rejection rate of thermocouple assemblies has been in evidence in the industry as a result of the stresses induced by the differential of thermal strains extant across their hot end junctions. The presence of these stresses becomes particularly detrimental where ultimate generator utilization will involve thermal cycling and induce consequent stress fatigue at the hot junction. Further, where long operational life spans are contemplated for the generator designs, this lack of thermal compatibility contributes a negative reliability factor to be accounted for in establishing maintenance specifications.

(c) Chemical compatibility

Looking next to the design necessity for providing a thermocouple structure which is chemically compatible, two characteristics are considered. First, the thermoelectric material should be immunized from oxidation or other similar chemical reaction under the high temperatures prevalent in the vicinity of the hot shoe. Secondly, the sublimation or direct loss of thermoelectric materials due to volatilization at the higher temperatures of the hot shoe should be controlled.

Attempts at achieving chemically compatibility, for the most part, have been restricted to schemes wherein the entire thermoelement has been encapsulated within a protective sheath. This approach to the problem, while protecting the thermoelectric materials, is found to destroy or unduly diminish a desired temperature differential progressing from the hot to the cold end of the thermoelement. As a consequence, most generator designers have chosen not to compromise the efficiencies derived from the more desirable temperature distribution and a certain degree of sublimation and oxidation is generally permitted to progress over the programed life span of the thermopile. The problem of thermoelement constituent sublimation has been in evidence particularly in connection with lead telluride materials now found desirable for use in fabricating P type elements. Generally, the tellurium constitutent is incorporated within the elements in amounts above stoichiometric proportion. Having a vapor pressure of 1.46 mm. mercury at 1000° F., the excess tellurium is prone to sublimate when exposed to temperatures within ranges otherwise considered to promote optimum generator efficiencies.

(d) Shock resistance

The practice of encapsulating the thermoelements has also been utilized for generator design parameters setting forth requirements for high external shock resistance. More typical shock resisting techniques, however, provide for retaining devices and the like which are adapted to maintain the elements under a compressive loading in order to accommodate their brittle nature. Recesses or counterbores slightly larger than the diameters of the elements have been formed within the hot shoes of thermocouples to facilitate solder bonding and, as such, will contribute a modicum of element strength at the bond. However, when thusly mounted within the hot shoe, the earlier discussed thermoelectric compatibility problems of metallic diffusion from the hot shot poisoning the elements reappear to diminish a gain in strength factor.

SUMMARY

The inventive junction assembly for bonding thermoelements to hot shoes as is now presented offers solution to the deficiencies and drawbacks outlined above by providing, inter alia, a novel thermally and electrically conductive cup structure which serves as a diffusion barrier between the surface of the hot shoe and the thermoelement hot end.

The cup device of the novel junction assembly is particularly characterized by its very thin thickness. By virtue of its fabrication from very thin sheet stock, the cup portion of the junction is found to adopt and contort in sympathy with the thermal straining of any hot shoe to which it is bonded. As a result of this sympathetic straining, diffusion barrier materials which would otherwise introduce thermal stresses into thermoelements at their heat receiving ends may be incorporated without detriment into a thermocouple assembly. The thermojunction arrangement of the invention, therefore, affords a broadended range of materials selection to a generator designer, allowing greater freedom to resolve and correct for factors of degradation beyond that of thermal strain.

The novel cup portion of the instant junction assembly has been determined to provide adequate thermoelectric compatibility between the united hot shoe and thermoelement of a thermocouple even though it is characterized in having a very thin dimension. While fabricated having a thickness in the order of only about 3 mils, the cup structure has been observed to act as an effective diffusion barrier for preserving requisite higher Seebeck coefficient values and desirably lower resistivity values.

As a consequence of combining the attributes of low thermal strain induced stress along with a requisite thermoelectric compatibility characteristic at each hot shoe-thermoelement junction, the present junction assembly is characterized in effecting a lowered thermocouple degradation and a lengthened operational life span.

The thermoelectric junction assembly of the invention is further characterized by virtue of its capability for enhancing the aforedescribed chemical compatibility of the thermoelements bonded within a thermocouple. The cup portion of the instant arrangement is fashioned incorporating an upstanding peripheral flange of thin dimension. Having a height amounting to about one-tenth of the length of each thermoelement, the flange when mounted, extends over the hotter surface portion of the thermoelectric material. Thusly mounted, the flange serves to afford surface protection to that portion of the thermoelement which is most susceptible to oxidation degradation. Similarly, the flange portion serves to provide a protective shield against the sublimation of important ingredients of the thermoelectric material at that hotter portion of the assembly most prone to induce material vaporization.

As a result of its relatively short height, however, the flange portion does not inefficiently disturb or degrade a requisite thermal gradient which must be maintained along the length of each thermoelement.

From the foregoing, it may be observed that the junction assembly of the invention evolves the advantages of improved long term generator power output as a result of lessened degradation.

A further object of the invention is to provide a thermocouple junction assembly which, in addition to enhancing thermoelement degradation resistance, is also characterized in providing an enhanced resistance to mechanical rupture due to externally derived shock.

Another object of the invention is to provide a junction assembly for a lead telluride P type element which imparts to the thermoelement an enhanced resistance to oxidation and sublimation.

An additional object of the invention is to provide a thermocouple junction assembly which is inexpensive to fabricate and which simplifies the procedure for bonding thermoelements to electrodes and hot shoes.

DESCRIPTION OF THE PREFERRED EMBODIMENT

Figure 1:
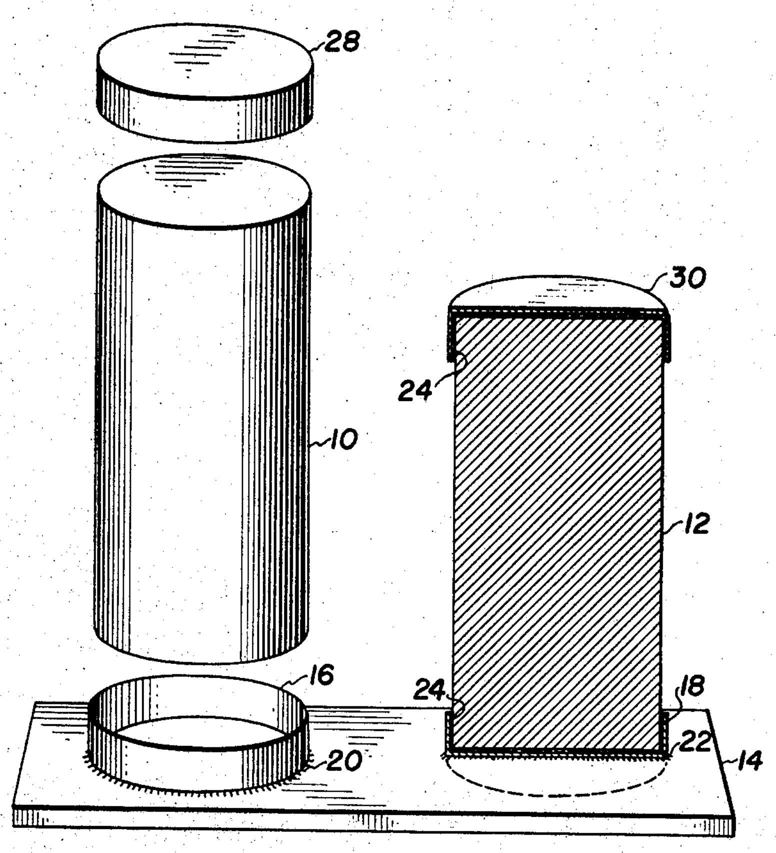
FIG. 1 is a perspective view of a thermocouple showing in both exploded and cut-away fashion the novel junction assembly of the invention.

Looking to FIG. 1, a thermocouple is depicted incorporating the junction assembly of the invention. The thermocouple is fashioned having cylindrical thermoelements 10 and 12 spaced apart in parallel alignment for attachment to a hot shoe 14. At the heat receiving side of the thermocouple, the thermoelements 10 and 12 are shown insertable within cup structures respectively depicted at 16 and 18. Each of the cups 16 and 18 are fabricated having diameters slightly larger than the thermoelements and having upstanding flanges within which the thermoelements will readily nest. The cups 16 and 18 are respectively bonded, preferably by brazing, to the hot shoe upper surface as is indicated at 20 and 22, while the thermoelements are bonded with a compatible braze or solder to the interior of the cups. A representation of the latter bond is provided at 24. It may be observed from the foregoing description that the structuring of the inventive junction is ideally uncomplicated. In view of this simplicity, the cups may also be utilized to provide protective electrical contact terminals at the cold ends of the thermoelements. Such an arrangement is shown in the drawing wherein a cup 28 is positioned to cover the cold end of thermoelement 10 and a cup 30 is depicted forming a contact terminal for the cold end of thermoelement 12.

It will be apparent to those skilled in the art that the cup structures will also find use where segmented, multi-element thermocouples are desired. In this application, all cup flanges would preferably point away from the hot shoe.

Returning in more detail to the hot shoe-thermoelement junction assembly, the cup as at 16 is formed from a material selected to provide thermoelectric compatibility with the material of the thermoelement. It is essential that the material chosen serves as an effective barrier between the thermoelement and the hot shoe. The barrier must prevent impurities generally inherent in the material of the hot shoe from diffusing by intercrystalline disturbance into the carefully structured material of the thermoelement. At present, iron is conventionally selected for serving the diffusion barrier function. But, as discussed earlier, the thermal coefficient of expansion of iron will not suitably match that of most thermoelectric materials.

It has been discovered, however, that the cup structure of the invention may be fabricated of such thin dimension that when bonded at its base to the hot shoe 14 it will contour in sympathy with the thermal straining of the hot shoe material. Moreover, even though an iron cup is formed having a thickness as small as 3 mils, it has been found to adequately function as a diffusion barrier over an extensive operational life span.

It has been determined convenient to fabricate the cups by conventional stamping techniques from sheet stock. When fashioned from iron, the cups will function adequately when formed having a thickness selected in a range from about 3 to about 7 mils.

The flange portion of the cup structure is formed having a height selected to provide, with a fillet of braze or solder, a protective sheath around the hottest portion of the thermoelement. A specific optimum height may be determined by theoretical computation so as to minimize degradation due to sublimation and oxidation. However, it has been determined empirically that a height amounting to about ten percent of the overall thermoelement length will generally afford a satisfactory chemical compatibility, and additionally preserve a requisite thermal gradient across the element.

(1) Assembly procedure

The initial requirement for manufacturing a thermocouple in accordance with the invention is that of selecting a hot shoe material having a coefficient of thermal expansion matching that of the preselected thermoelectric elements. This section will generally evolve a hot shoe which, in and of itself, would poison the preselected thermoelectric material were it not for a diffusion barrier. A suitable cup material is then selected with concern only for thermoelectric compatibility and formability. For example, iron is suitable for the thermoelements formed substantially of lead telluride, while certain of the more modern P type elements such as those formed from silver-antimony-germanium-telluride may be combined with cups formed from tantalium, beryllium, titanium, molybdenum, tungsten or columbium. The thicknesses of the cups formed from the latter materials will vary with respect to both their diffusion barrier capabilities and, more particularly, their tensile strengths. It will be recalled that sufficient bond must be established between the cup and hot shoe face so as to override and dominate the thermal expansions of the cup material.

Following the fabrication of the cup, the hot shoe or strap and cup are joined by a suitable bonding technique using relatively higher melting point materials. For instance, the cups may be joined by a nickel-manganese, nickel-chrome or similar braze. Additionally, the cups may be welded or soldered with a high melting point (i.e. about 1200° F.) silver solder.

Upon cleaning the assembly and thermoelements using conventional techniques, the thermoelements are readily bonded to the cups by first inserting between the cup and element a small, carefully dimensioned wafer of a compatible braze such as tin telluride. The wafers are dimensioned so as to produce just enough solder to fill the interstices between the flanged cup and element. Furnace bonding under inert atmosphere is generally preferred to effect the brazing or soldering operation. A secondary advantage is gained with the use of the cup structure during bonding. The flanged portions of the cups serve to retain the solder or like bonding materials and prevent the same from flowing into contiguous thermoelement junctions. Heretofore, shallow counterbores within the hot shoes were necessitated for this purpose.

The somewhat remarkable long term power output improvements which may be realized with the utilization of the present junction assembly are more fully portrayed in connection with the following comparative testing:

EXAMPLES

Example I

A test group of five thermocouples were fabricated using the junction assembly of the invention. The thermoelements of the couples utilized thermoelectric materials procured from a leading manufacturer who uses the cold press and sintering process for fabrication of elements. Multi-point resistance checks were made on all elements to assure conformity. The P type elements comprised a sodium doped lead telluride having a tellurium constituent present in excess of stoichiometric proportion. The N-type elements comprised an iodine doped lead telluride believed to have an excess of lead. The elements were of 0.5 inch diameter and 0.5 inch length.

Cup structures were fabricated having shapes in accordance with the invention from Ferrovac E sheet stock 0.003 inch thick. Ferrovac E is a very high purity iron procured from the Crucible Steel Company of America, Pittsburgh, Pa. Cup flange heights were about 3/32 inch.

The cups were attached to identical hot shoes formed from 300 series Austenitic stainless steel utilizing a commercially procured braze identified as "Premabraze 130," a mixture of about 82% gold and 18% nickel manufactured by Handy and Harmon, Inc., New York, N.Y. The aforedescribed cups were furnace bonded to both the hot and cold ends of the thermoelements using a tin-telluride braze and within a hydrogen atmosphere.

A control group of five thermocouples were fabricated. The thermoelements were identical to the above test group and were mounted upon Ferrovac E iron hot shoes. Conventional Ferrovac E iron disk-shaped caps were brazed to the cold ends of the thermoelements and the thermoelements were brazed to the hot shoes using bonding techniques as in the above test group. The iron disks were about 1/16 inch thick.

Both groupings were positioned under equal compression within the inert atmosphere of identical testing rigs. The hot junctions of both groupings were held at about 925° F. and the cold ends of the thermocouples were held at about 350° F.

Figure 2:
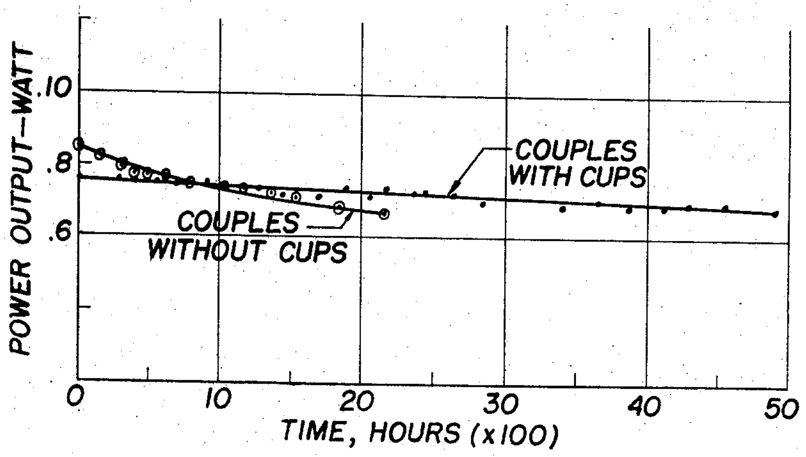
FIG. 2 is a power degradation chart showing the long term power output of a grouping of thermocouples fabricated according to the invention as compared with the output of a control grouping of thermocouples.

The output readings taken during the test are reproduced graphically in FIG. 2 where the average values of the five-couple groupings are shown. As may be evidenced from the drawing, those thermoelectric couples having the junction assembly of the invention were seen to evolve lowered degradation over a longer life span of operation. This result is particularly significant in connection with the P-type element having excess tellurium. The latter element has heretofore been difficult to protect from degradation due to the propensity of the tellurium constituent to sublimate in the vicinity of the hot junction. The present inventive cup structure is seen to markedly diminish that propensity.

Example II

A thermocouple was fabricated using the junction assembly of the invention. The thermoelements incorporated within the couple were fashioned from the same materials as described in connection with Example I and were of the same size. Both the N and the P thermoelements were furnace bonded at their hot and cold ends to cup structures fabricated in accordance with the invention using a tin-telluride braze. The cups were formed from Ferrovac E iron stock having a 3.5 mil thickness and had integral flanges 3/32 inch in height. The cups at the thermoelement hot ends were furnace bonded to a hot shoe formed of 300 series Austenitic stainless steel using a tin-telluride braze. The thusly assembled thermocouple was positioned within a testing rig identical to that of Example I. During the testing procedure, the hot side of the thermocoupled was maintained at about 900° F., while the cold side was maintained at about 200° F. The performance of the couple throughout a continuing test extending to 9000 hours is reproduced in Table I.

For comparative purposes, the performance of a thermocouple conventionally fabricated of the same materials and using the same techniques as described in connection with the control group of Example I is reproduced in Table I. This control thermocouple was also tested under a hot side temperature of about 900° F. and a cold side temperature of about 200° F.

TABLE I

| Time (hours) | Control thermocouple: Output (watts) | Control thermocouple: Percent degradation | Cup junction thermocouple: Output (watts) | Cup junction thermocouple: Percent degradation |
|---|---|---|---|---|
| 0 | 1.294 | | 1.098 | |
| 500 | 1.216 | −6 | 1.171 | 6.6 |
| 1,000 | 1.172 | −9.4 | 1.123 | 2.3 |
| 1,500 | 1.135 | −12.3 | 1.119 | 1.9 |
| 2,000 | 1.021 | −21.1 | 1.078 | −1.8 |
| 2,500 | 0.932 | −28.0 | 1.077 | −1.9 |
| 3,000 | 0.886 | −31.5 | 1.081 | −1.5 |
| 3,500 | 0.879 | −32.1 | 1.038 | −5.5 |
| 4,000 | 0.871 | −32.6 | 1.012 | −7.8 |
| 4,500 | 0.847 | −34.5 | 1.007 | −8.3 |
| 5,000 | | | 1.026 | −6.5 |
| 5,500 | | | 1.011 | −7.9 |
| 6,000 | | | 1.014 | −7.7 |
| 6,500 | | | 0.988 | −10.0 |
| 7,000 | | | 0.967 | −11.9 |
| 7,500 | | | 0.953 | −13.2 |
| 8,000 | | | 0.911 | −17.0 |
| 8,500 | | | 0.942 | −14.2 |
| 9,000 | | | 0.927 | −15.6 |
| 9,500 | | | | |

As may be evidenced from Table I, the thermocouple fabricated having a junction assembly in accordance with the invention evidences a very long and highly productive operational life span of operation.

It will be apparent to those skilled in the metallurgical and thermoelectric arts that many variations may be made in the detailed disclosure set out herein for illustrative purposes, without departing from the spirit or scope of the invention.

I claim:

1. A thermoelectric assembly comprising: a semiconductor thermoelectric element, a metal hot shoe member, a preformed metal cup structure having a base and an integral peripheral flange and positioned intermediate said element and said hot shoe member and:

(1) integrally mounted over one end of said element and intimately bonded thereto, (2) formed of a thickness on the order of 3 to 7 mils selected as the minimum required to establish an effective diffusion barrier intermediate said element and said hot shoe, (3) with said integral peripheral flange extending along the surface of said element to the maximum extent of one tenth the length of said element with said flange intimately bonded thereto for minimizing the sublimation of materials therefrom;

(a) said cup structure being intimately bonded to said hot shoe; and (b) said hot shoe being selected of a material different from that of said metal cup structure and having a thermal coefficient of expansion substantially near that of said element.

2. The thermoelectric assembly of claim 1 wherein said semiconductor thermoelectric material consists of silver-antimony-germanium telluride and said metal cup structure consists of one material from the group comprising; tantalum, beryllium, titanium, molybdenum, tungsten and columbium.

3. The thermoelectric assembly as claimed in claim 1 wherein said thermoelectric semiconductor material comprises lead telluride and said metal cup structure comprises iron.

References Cited

UNITED STATES PATENTS 2,496,346 2/1950 Haayman et al. ---- 136—237UX
2,811,569 10/1957 Fredrick et al. ------ 136—238
3,022,360 2/1962 Pietsch ------------ 136—203
3,057,940 10/1962 Fritts -------------- 136—233
3,082,277 3/1963 Lane et al. -------- 136—238X
3,201,504 8/1965 Stevens ---------- 136—201X
3,272,660 9/1966 Intrater et al. ------ 136—205
3,279,955 10/1966 Miller et al. -------- 136—205
3,330,029 7/1967 Duncan et al. -------- 29—573

ALLEN B. CURTIS, Primary Examiner

A. M. BEKELMAN, Assistant Examiner

U.S. Cl. X.R.

136—230, 237